United States Patent [19]

Counsell

[11] Patent Number: 5,369,362
[45] Date of Patent: Nov. 29, 1994

[54] METHOD OF AND APPARATUS FOR NMR TESTING

[75] Inventor: Christopher J. R. Counsell, Oxford, England

[73] Assignee: British Technology Group Limited, London, England

[21] Appl. No.: 209,482

[22] Filed: Mar. 14, 1994

Related U.S. Application Data

[63] Continuation of Ser. No. 935,704, Aug. 26, 1992, abandoned.

[30] Foreign Application Priority Data

Aug. 20, 1992 [GB] United Kingdom ............... 9217718.7

[51] Int. Cl.$^5$ .............................................. G01V 3/00
[52] U.S. Cl. ........................................ 324/309; 324/307
[58] Field of Search ............... 324/300, 307, 309, 310, 324/311, 312, 314

[56] References Cited

U.S. PATENT DOCUMENTS

| | | | |
|---|---|---|---|
| 4,695,800 | 9/1987 | Kramer et al. | 324/309 |
| 4,703,268 | 10/1987 | Gyngell et al. | 324/309 |
| 4,789,832 | 12/1988 | Nagayama | 324/307 |
| 4,814,708 | 3/1989 | Van Der Meulen et al. | 324/307 |
| 4,884,029 | 11/1989 | Sattin | 324/309 |
| 4,924,183 | 5/1990 | Kunz et al. | 324/309 |
| 4,983,921 | 1/1991 | Kramer et al. | 324/309 |

FOREIGN PATENT DOCUMENTS

0507551A1 10/1992 European Pat. Off. .

OTHER PUBLICATIONS

Heid and Deimling, "QUEST", Society of Magnetic Resonance in Medicine 9th Annual Mting and orally at a conference in Berlin on 12 Aug., 1991.

Heid, Deimling and Huk, "QUEST", Journal of Soc. of Magnetic Resonance in Medicine, vol. 29, No. 2, pp. 280–283, Feb. 1993.

Pipe, Abstracts of 9th Annual Mting of Soc. of Magnetic Resonance in Medicine 9th Annual Mting. of Aug. 1992, p. 103, Aug. 1992.

Mansfield and Maudsley, J. Phys. C: Solid State Phys., vol. 9, 1976, pp. L409–L412 (no month).

Mansfield and Maudsley, Journal of Magnetic Resonance, vol. 27, pp. 101–119, 1977 (no month).

Primary Examiner—Louis Arana

[57] ABSTRACT

Apparatus and method for nuclear magnetic resonance (NMR) testing an object includes subjecting the object to a magnetic field, the field comprising a gradient component ($G_{read}$) for encoding spatial information about the object, applying excitation pulses (R.F.) at selected intervals to excite nuclear magnetic resonance, at least two of the intervals and the encoding gradient component during those intervals being selected such that, for such intervals, the values of the integral of the gradient component with respect to the interval duration are proportioned according to consecutive powers of an integer, I, greater than two, and detecting the resonance response signals.

26 Claims, 12 Drawing Sheets

METHOD OF AND APPARATUS FOR NMR TESTING

This is a continuation of application Ser. No. 07/935,704, filed Aug. 26, 1992now abandoned.

BACKGROUND OF THE INVENTION

1. Field of the Invention

This invention relates to a method of and apparatus for nuclear magnetic resonance (NMR) testing an object. The invention has particular application to the generation of images of animals or humans by NMR.

2. Related Art

NMR imaging techniques are well-known. One such technique is described in a paper entitled "Planar Spin Imaging by NMR", P. Mansfield and A. A. Maudsley (J. Magn. Resonance, 27, pp 101–119). Another technique is Known as the "Echo Planar Imaging" (EPI) technique, and is disclosed in United Kingdom Patent No. 1596160 to the National Research Development Corporation (now British Technology Group Ltd.). This technique involves subjecting the object to be tested to a magnetic field which Includes three mutually orthogonal gradient components for encoding spatial Information about the object. One of the gradient components has an oscillatory waveform. A radiofrequency excitation pulse is applied to the object in the presence of the magnetic field. The oscillating gradient causes resonance response echoes to be formed subsequent to the application of the excitation pulse. Detection of these echoes rapidly yields an Image of the object.

The EPI technique suffers from the drawback that the oscillating gradient component is required to oscillate at a frequency so high that special and expensive hardware is required to effect the requisite rapid gradient switchings.

SUMMARY OF THE INVENTION

According to the present invention, there is provided a method of NMR testing an object, comprising subjecting the object to a magnetic field, the field having a gradient component for encoding spatial information about the object, applying excitation pulses at selected intervals to excite nuclear magnetic resonance, at least two of the intervals and the encoding gradient component during those intervals being selected such that, for such intervals, the values of the integral of the gradient component with respect to the interval duration are proportioned according to consecutive powers of an integer, I, greater than two, and detecting the resonance response signals.

By selecting the pulse Intervals and the encoding gradient component in this way, a large number of distinct, uniformly spaced echo responses can be generated without the need for more than a relatively modest number of gradient switchings (if any at all). The gradient switchings which may be required do not necessitate the use of special hardware, so that the present invention can be implemented on conventional NMR hardware. The present Invention is capable of rapid imaging; a two-dimensional slice through the object can be imaged in 40 ms or less.

Preferably, the magnetic field and/or the excitation pulses are adjusted (from initial estimates of their values) to provide the desired resonance response signals. Such adjustment can help to remove the effects of imperfections in the NMR apparatus actually employed. The most important imperfection is that there can be differences (caused, for instance, by eddy currents) between the waveform of the energisation applied to the magnet coils and the waveform of the actual magnetic field produced by them. Thus, if the Integral of the gradient component referred to previously is calculated from the energisation applied to create the gradient component, rather than from the gradient component actually produced, adjustment from the chosen energisation may be required.

The adjustment may be effected theoretically by applying a calibration factor to the field or pulses, but preferably it is effected by experimental calibration, based on experimentally predetermined information. An advantage of this latter approach is that the experimental calibration is not dependent on the object, but only on the NMR apparatus, so that, in principle at least, the experimental calibration need only be performed once.

Typically, the adjustment is utilised to provide the desired timing for the signals, since such timing can be critical to the operation of the Invention. If the timing is insufficiently uniform, signals may merge and the accuracy of the results may deteriorate.

Preferably, resonance response signals are adjusted (corrected) after detection. Such adjustment, which would usually take place before Fourier transformation, can be used to prepare the response signals ready for Fourier transformation. For instance, the invention almost inevitably produces non-uniform signals; if so, the signals can all be adjusted before Fourier transformation to be uniform. Further, the phase of the signals may need to be adjusted; their timing may also need to be adjusted so that they are uniformly spaced. In this last case, it may be desirable to provide a coarse adjustment using the calibration techniques outlined above as well as a fine adjustment via the presently described correction techniques.

The interval between the last excitation pulse proportioned according to a power of I and the succeeding excitation pulse is preferably less than $I^L \cdot t_{min}$, where L is the number of such intervals and $t_{min}$ is the smallest interval, and said interval is more preferably equal to $$\frac{(I^L + 1)}{2} \cdot t_{min}.$$

In this way, the duration of an experiment can be reduced from that which would pertain if all the relevant pulse intervals were proportioned according to consecutive powers of I, without there necessarily being any attendant loss of signals. This is explained in more detail under the "Theory for the basic embodiment" section.

To obtain a reasonably well-resolved image, at least three excitation pulse Intervals should be proportioned according to powers of I. With three intervals (four pulses) a potential maximum of 27 signals can be generated for I=3. In practice, only a proportion (for instance, 9 or 14) of these signals can actually be detected unless refocussing of the signals is effected.

In the basic embodiment of the invention (see Example 1), the gradient component is substantially constant during such intervals, and such intervals are proportioned according to said consecutive powers. This is a simple form of the invention, with minimal gradient switchings.

In a first modified embodiment of the invention, (see Examples 2 or 3) if the gradient component is zero during each excitation pulse adjacent such intervals, and if, further, it rises in each such interval for a rise time $t_1$ to a value which is equal for each such interval, remains at such interval for a dwell time $t_2$ and falls back to zero for a fall time $t_3$, then preferably the respective values of $t_2+(t_1+t_3)/2$ for each such interval are proportioned according to said consecutive powers. This represents a simple but effective way of determining suitable excitation pulse intervals if (as is preferable to avoid restricting the field of view) the gradient component is switched off during each excitation pulse.

In a second modified embodiment of the invention (see Example 3) a further excitation pulse is applied to refocus the resonance response signals. By refocussing the signals (that is, producing an "echo" of these signals) the resolution achievable with the invention can be significantly increased.

In a third modified embodiment of the invention, slice selection is performed via a non-filtering gradient pulse (that is, a gradient pulse which does not filter out any of the resonance response signals). If a slice selection excitation pulse is applied during the gradient pulse, then preferably this is achieved by making the integral of the gradient pulse with respect to time up to the centre of the slice selection pulse and the equivalent integral taken after the centre both equal to zero.

Apparatus features analogous to the method features described above are also provided by the present invention.

BRIEF DESCRIPTION OF THE DRAWINGS

Preferred features of the invention, the theory underlying the invention, and examples of the operation of the invention are now described with reference to the accompanying drawings, in which.

DETAILED DESCRIPTION OF THE EXEMPLARY EMBODIMENTS

In the ensuing description, the following abbreviations and terms are used, with definitions as given.

| | |
|---|---|
| $\gamma$ | The gyromagnetic ratio. |
| $\Delta t$ | The dwell time or sampling interval. |
| $\Delta p$ | The changes in coherence order induced by each radiofrequency (r.f.) pulse. |
| $\Phi^p, \Phi$ | The phase of the signal, $P$, originating from a particular location. |
| $\phi$ | The phase of a signal relative to the receiver r.f. phase. |
| $\rho^{(k)}, \rho^{(r)}$ | The data forming the k-space and real space images. |
| $FOV_x$ | The field of view, in centimeters, along the phase-encoding direction. |
| $FOV_y$ | The field of view along the read direction. |
| $G_{phase}$ | The set of phase-encoding gradient pulses. |
| $G_{read}$ | The set of read gradient pulses. |
| $k_x, k_y$ | Components of k-space, with dimensions $cm^{-1}$. |
| $N$ | The total number of r.f. pulses. |
| $N_1, N_2$ | The number of data points acquired in each dimension. |
| $p_i$ | The coherence order of a signal (for spin-$\frac{1}{2}$ particles $p_i$ can be $+1, 0$ or $-1$). |
| $P$ | The coherence transfer pathway - an ordered set of the coherence orders of a signal after each r.f. pulse. |
| $Q^p_{phase}$ | The net phase gradient developed along the phase-encoding direction for signal $P$. |
| $Q_{phase}$ | The set of phase gradients arising from the phase-encoding gradient pulses. |
| $Q_{phase_i}$ | $= \int \gamma G_{phase}(t)dt$ integrated over the appropriate time interval. |
| $Q_{read}$ | The set of read gradients arising from each read gradient pulse. |
| $Q_{read_i}$ | $= \int \gamma G_{read}(t)dt$ integrated over the appropriate time interval. |
| $r_x, r_y$ | Components of real space. |
| $SW$ | The spectral width $= 1/\Delta t$. |
| $t_i$ | The time interval between the ith and $(i + 1)$th r.f. pulse. |
| $t^p_{echo}$ | The echo time for a signal following pathway $P$. |
| $t_{min}$ | The shortest pulse interval in $t_{rf}$. |
| $t_{rf}$ | The list of all r.f. pulse intervals $t = (t_1, t_2, \ldots)$. |
| $x$ | Refers to the phase encoding direction. |
| $y$ | Refers to the read (frequency encoding) direction. |
| $z$ | Refers to the slice selection direction. |
| $Z_{kx}$ | A complex correction factor associated with each signal. |

Figure 1:
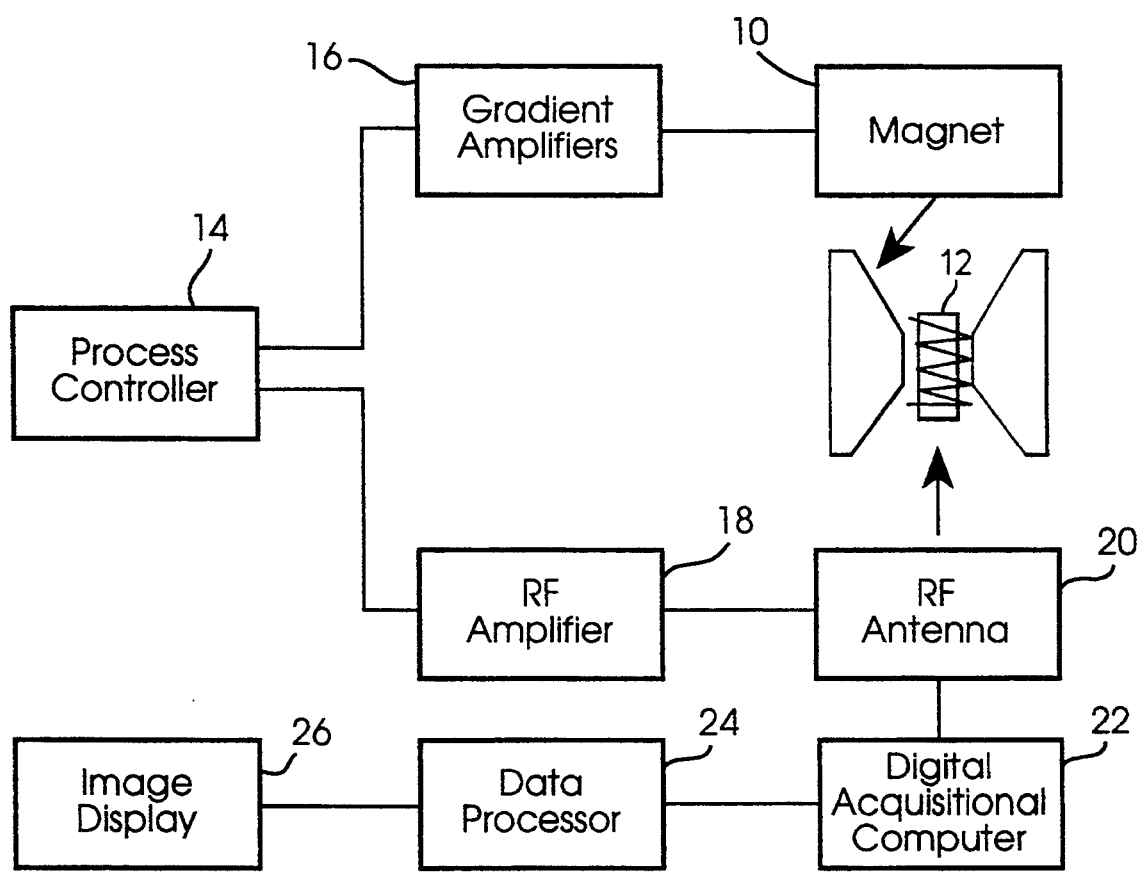
FIG. 1 is a block diagram of apparatus for NMR testing according to the present invention.

Referring to FIG. 1, apparatus for NMR testing includes a magnet 10 for subjecting the object 12 to a magnetic field. The magnet is capable of producing both a large static magnetic field and also three mutually orthogonal magnetic field gradients in directions x, y and z (phase-encoding, read and slice selection gradients respectively). The gradients are controlled by a process controller 14 via gradient amplifiers 16. The process controller 14 also controls the application of radiofrequency excitation pulses at selected intervals to excite NMR resonance in the presence of the magnetic field via r.f. amplifier 18 and r.f. antenna 20. Resonance response signals are detected using the r.f. antenna 20, acquired using data acquisition computer 22, processed using data processor 24 and displayed using image display 26.

For the purposes of the present invention, the apparatus should be capable of delivering gradient pulses as short as 2-3 ms, although gradient rise rates do not have to be particularly fast; 2 $Gcm^{-1}ms^{-1}$ (equivalent to 0.2 $Ts^{-1}$) is acceptable. The capability to shape the r.f. excitation pulse is important if frequency selective excitation is required.

Figure 2:
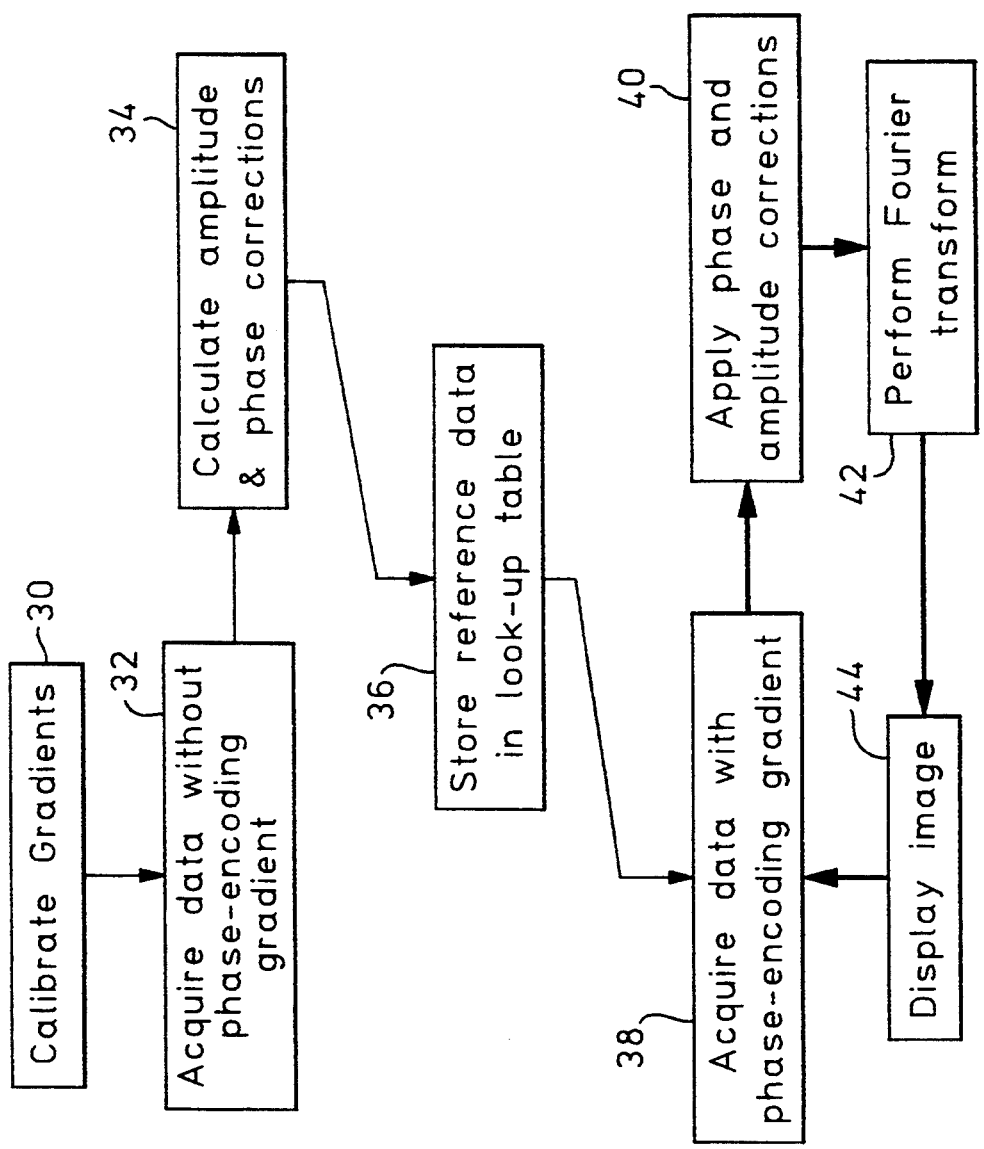
FIG. 2 is a schematic overview of the operation of the present invention.

With reference to FIG. 2, in overview the procedure for acquiring images is as follows. Firstly, the magnetic field gradients are calibrated (Box 30)—see the section entitled "Experimental calibration of the gradients to achieve the desired timing of the echoes". Next, an initial experiment is carried out to acquire data in the absence of the phase-encoding gradient (Box 32). A look-up table of requisite corrections to the phase and amplitude of the r.f. pulses is then generated (Box 34) and stored for use in all future experiments (Box 36)—see the section entitled "Phase and amplitude corrections". Further experiments as appropriate are then carried out in the presence of the phase-encoding gradient (Box 38), with r.f. pulses corrected according to the look-up table (Box 40). Resonance response signals are Fourier transformed once acquired (Box 42) and the resulting data displayed as an image (Box 44).

The theory underlying the basic embodiment of the present invention is now described with reference to FIGS. 3 and 4. In broad terms, the invention sets out to generate multiple response signals using a relatively short set of r.f. excitation pulses, separately phase encode each signal, and then subsequently detect echoes of the signals in one acquisition period.

Theory for the Basic Embodiment

The theory underlying the basic embodiment is now described. Analysis of the theory is best performed using the principles of coherence transfer. Signals obtained from isolated spin-½ nuclei (such as protons in water) can possess a coherence order of 0, −1 or +1 corresponding to the longitudinal magnetisation, and the observable and unobservable components of the transverse magnetisation respectively. Transitions in coherence order are caused by r.f. pulses splitting each original signal into three new signals. The coherence transfer pathway is represented by a vector $p = (p_1, p_2, \ldots)$ where the $p_i$ are the coherence orders after each r.f. pulse and may thus be $+1$, 0 or $-1$. The pathway $(1, -1)$ generated by two pulses is referred to as a spin echo, whereas the signal $(1, 0, -1)$ generated by three pulses is a stimulated echo.

A series of N pulses can generate up to $3^{N-1}$ distinct signals, each of which will have followed a unique coherence transfer pathway. The timing for the appearance of each echo signal depends (amongst other things) upon the intervals between the r.f. pulses and the coherence pathway of the signal. If the intervals between pulses are represented by a vector $t_{rf} = (t_1, t_2, \ldots t_N)$, where $t_N$ represents the time interval between the final pulse and the centre of the relevant echo, then the condition required to generate an echo is $$t_{rf} \cdot p = 0 \qquad [1]$$

which is effectively a condition on $t_N$ when all the other $t_i$ are fixed.

It follows from Equation [1] that if the interpulse intervals are proportioned according to distinct, consecutive powers of 3 such that $t_i (i < N) = 3^j \cdot t_{min}$ for some unique $j \geq 0$, then the signals will be equally spaced. This may be deduced by deriving an expression for $t_N$ from Equation [1] in terms of the other $t_i$, substituting in turn all the different values for p, and counting in base 3. $t_{min}$ is the smallest delay in $t_{rf}$ achievable with the particular apparatus employed.

For any coherence pathway p (whose components, $P_i$, may be $+1, 0$ or $-1$)

$$t_{rf} \cdot p = t_{min} \sum_{i=1}^{N-1} 3^{i-1} p_i - t_N \qquad [2a]$$

$$= t_{min} \cdot m - t_N \qquad [2b]$$

where m is a member of the set of integers spanning the range $$\frac{-(3^{(N-1)} - 1)}{2} \text{ to } \frac{+(3^{(N-1)} - 1)}{2}$$

(again counting in base 3). We define the echo time for each echo signal as the interval from the first r.f. pulse to the centre of the signal maximum, whence $$t^p_{echo} = \sum_{i=1}^{N} t_i \qquad [3]$$

$$= \left[ \frac{(3^{(N-1)} - 1)}{2} + m \right] \cdot t_{min}$$

(under the conditions defined above and using Equation [2b]).

Of the total signals, $$\frac{(3^{(N-1)} + 1)}{2}$$

may be classified as virtual echoes since their maxima would occur before or during the final pulse (i.e. $t^p_{echo} \leq 0$). In addition, if a single slice selection magnetic field gradient pulse is applied in conjunction with the final r.f. pulse, as in conventional slice selection, then only the $3^{(N-2)}$ signals whose coherence order changes from $+1$ to $-1$ (i.e. any signal for which $p = (p_1, p_2, \ldots +1, -1)$ will remain. This restricts m in Equations [2b] and [3] to a range of $$\frac{(3^{(N-2)} + 1)}{2} \text{ to } \frac{(3^{(N-1)} - 1)}{2}.$$

If the time interval, $t_{N-1}$, between the final pulse and the penultimate pulse is set at or greater than $t_{min}$.

$$\frac{(3^{(N-2)} + 1)}{2},$$

then all of the $3^{(N-2)}$ signals will appear after the final pulse (see Equation [1]). Equation [2b] is unchanged by this action except that m is shifted into the range $+1$ to $+3^{(N-2)}$ and Equation [3] becomes $$t^p_{echo} = [3^{(N-2)} + m] \cdot t_{min} \qquad [4]$$

Thus $t_{rf} = t_{min} \cdot (1, 3, \ldots 3^{(N-3)}, \frac{1}{2}(3^{(N-2)} + 1), m)$ or an equivalent set obtained by permutation of the first N−3 intervals. For example, for N=5 pulses $t_{rf} = t_{min} \cdot (1, 3, 9, 14, m)$ or an equivalent set obtained by permutation of the first 3 intervals and m is a respective integer in the range 1 to 27 to satisfy Equation [1] for each of the signals. The amplitudes of all the signals are maximized if the fifth and final pulse corresponds to a 180° flip angle.

Since the formation of echoes is based on the refocussing of the effects of static magnetic field inhomogeneities the deliberate application of a uniform gradient will have no effect on the timings of the signal maxima. Hence one-dimensional spatial information can be encoded into each signal by applying a constant read gradient throughout the experiment. The more general situation where the read gradient is not constant is considered later. Further, to generate a 2D image it is necessary to obtain a set of signals that have been acquired with distinct phase gradients across the sample. In the basic embodiment of the present invention, complete phase-encoding is achieved by applying a constant gradient. Again, the more general situation of a non uniform phase-encoding gradient is considered later.

If a single slice selection gradient pulse is applied in conjunction with the final r.f. pulse, then in this embodiment the phase-encoding gradient is switched off before the penultimate r.f. pulse. This ensures that the middle echo (which follows the coherence pathway $p=(0,0,0,1,-1)$) receives no phase-encoding. The amount of phase-encoding, expressed as the net phase gradient developed across the sample during the experiment, is then given for each signal as $$Q^p_{phase} = \gamma G_{phase}(p_1 t_1 + p_2 t_2 + \ldots + p_{N-2} t_{N-2}) \text{rad cm}^{-1} \quad [5a]$$
$$= p \cdot Q_{phase}$$
$$= \gamma G_{phase} \cdot t_{min} \cdot l \quad [5b]$$

where the second line defines a vector $Q_{phase} = \gamma G_{phase}(t_1, \ldots, t_{N-2}, 0, 0)$ and the final equality is obtained in an analogous manner to Equation [2b] with $l$ lying in the range $$\frac{-(3^{(N-2)} - 1)}{2} \text{ to } \frac{+(3^{(N-2)} - 1)}{2}.$$

For completeness, $Q^p_{read}$ can be defined as $$Q^p_{read} = p \cdot Q_{read} \quad [6a]$$

with $$Q_{read} = \gamma G_{read} t_{rf}. \quad [6b]$$

The total signal is acquired as $N_1 \times N_2$ complex data points. For each data point the phase acquired by a signal originating from a particular location is unique. If $r_x$ is defined as the phase-encoding direction and $r_y$ the read direction then this phase is given by $$\Phi^p = Q^p_{read} r_x + Q^p_{read} r_y \quad [7]$$

Provided the echo maxima are well separated the total data set can be split into $N_1$ separate sets of data each containing one echo maximum, with no interference between signals. Therefore for each signal we can write for the points on either side of the maximum $$Q^p_{read} = m \Delta t \gamma G_{read} - \tfrac{1}{2}(N_2-1) < m < \tfrac{1}{2}(N_2-1) \quad [8]$$

and ignore the contributions outside this region. $\Delta t$ is the data sampling interval or dwell time. Using Equations [5] and [8] allows Equation [7] to be rewritten as $$\Phi = \gamma.l.G_{phase}.t_{min}.r_x + \gamma.m.G_{read}.\Delta t.r_y \quad [9]$$

with $l$ as the index for the signal, ranging from $-\tfrac{1}{2}(N_1-1)$ to $+\tfrac{1}{2}(N_1-1)$, and $m$ as the index for each data point within the signal, ranging from $-\tfrac{1}{2}(N_2-1)$ to $+\tfrac{1}{2}(N_2-1)$. The superscript p, to identify the signal pathway, has been dropped since each data point only contains a contribution from a single signal, identified by the index l. Equation [9] now allows the definition of k-space as the Fourier conjugate of real space $$\Phi = 2\pi k.r \quad [10]$$

with $$k_x = \gamma.l.G_{phase}.t_{min}/2\pi \quad [11]$$

and $$k_y = \gamma.m.G_{read}.\Delta t/2\pi \quad [12]$$

To avoid aliasing, $k_x$ is bounded by $\pm(N_1-1)/(2FOV_x)$ and $k_y$ by $\pm(N_2-1)/(2FOV_y)$, where $FOV_x$, $FOV_y$ are the maximum linear dimensions (field of view) in each direction and $N_1$, $N_2$ are the number of signals and number of data points per signal respectively. Thus if the time domain data are represented as points in k-space, each signal will contribute a complete row from bottom to top on the uniform rectilinear grid in FIG. 3.

Before discussing aspects of the data processing, generalisations of the experiment and practicalities of its implementation, an example of a basic imaging experiment will now be described. The experimental conditions are defined from the resolutions of the image ($N_1 \times N_2$ pixels), the field of view ($FOV_x \times FOV_y$) and the strength of the read gradient, $G_{read}$.

EXAMPLE 1

Figure 3:
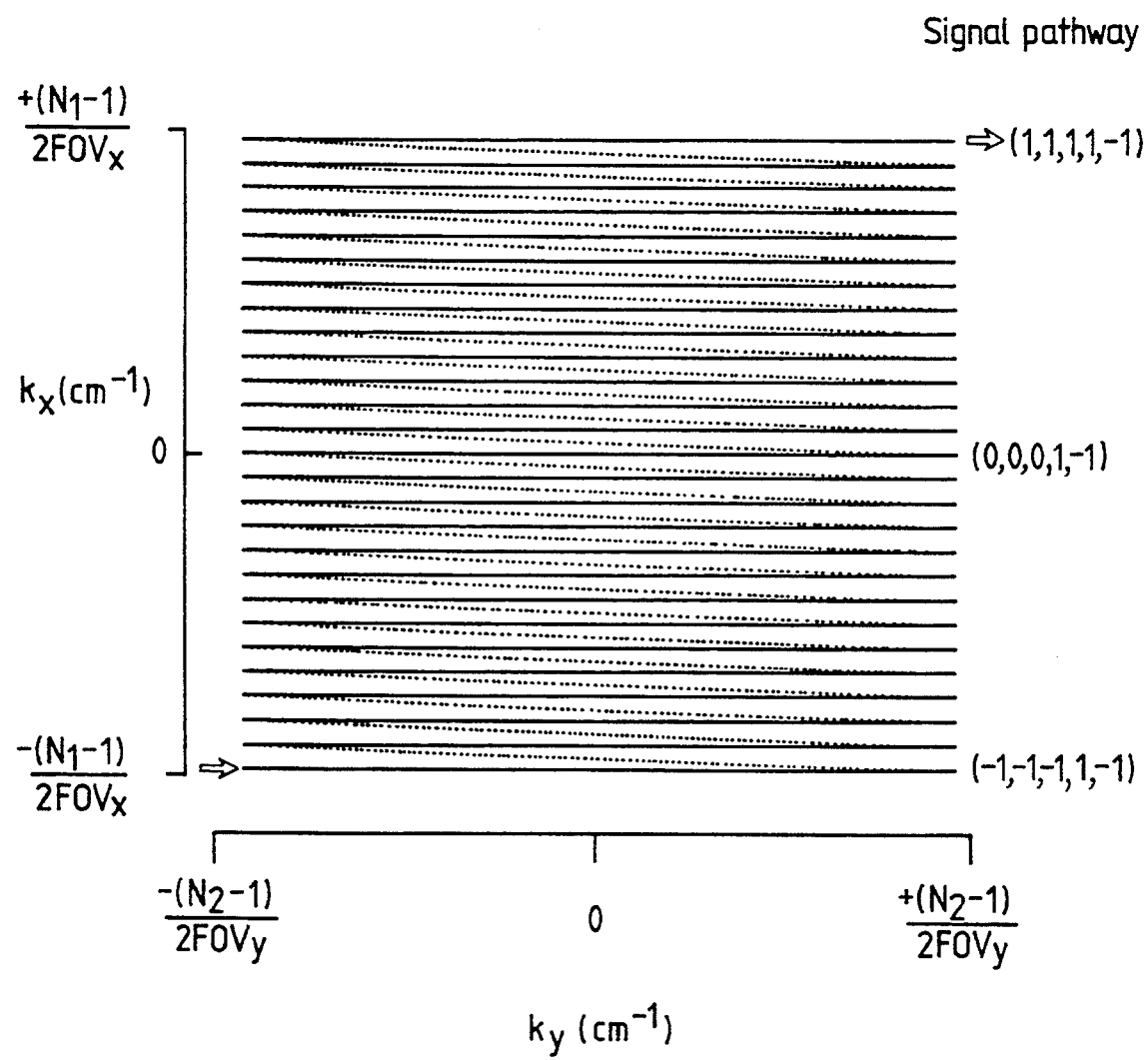
FIG. 3 is a k-space diagram for the basic embodiment of the invention.
Figure 4:
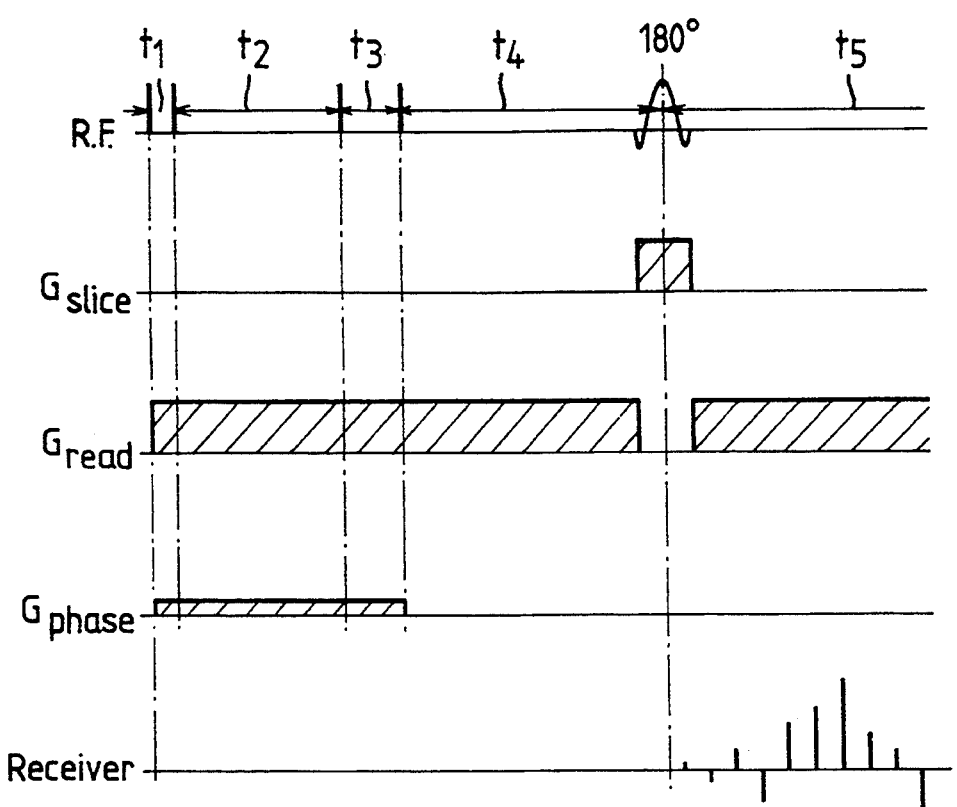
FIG. 4 is a pulse sequence diagram for the basic embodiment.

To generate a 27×64 pixel image of an object inside a field of view of 10 cm×10 cm with $G_{read}=2$ G cm$^{-1}$ (see FIGS. 3 and 4).

From the bounds placed on $k_y$ in Equation [12] the maximum sampling interval, $\Delta t$, is $$\frac{2\pi}{\gamma \cdot G_{read} \cdot FOV_y}.$$

If we take the gyromagnetic ratio for protons as 26747rad.s$^{-1}$.G$^{-1}$ ($\gamma/2\pi = 4257$ HzG$^{-1}$), then $$\Delta t = 1/(2 \times 10 \times 4257) = 11.7 \ \mu s$$

corresponding to a spectral width of $$SW = (\Delta t)^{-1} = 85140 \text{ Hz}$$

The smallest pulse Interval must be not less than $$t_{min} = N_2 \Delta t = 0.75 \text{ ms}$$

to ensure that the signals do not overlap.

Five r.f. pulses, the final one being a 180° pulse, generate $3^{5-2} = 27$ observable signals, so m in Equation [4] ranges from +1 to +27. To generate an image in the shortest time the pulse intervals should be $t_{rf} = t_{min}(1,3,9,14)$, with any permutation of the first 3 intervals allowed.

The phase-encoding gradient is switched on immediately after the first pulse and switched off immediately before the 4th pulse. The amplitude of the gradient is determined from the bounds on $k_x$ in Equation [11], which gives $$G_{phase} = \frac{2\pi}{\gamma \cdot FOV_x \cdot t_{min}} = 0.312 \, G \, cm^{-1}$$

Then, from Equation [5], $$Q_{phase} = \frac{2\pi}{FOV_x} (1,3,9,0,0) \, rad \, cm^{-1},$$

or again any corresponding permutation of the first 3 intervals. The centre of the first signal occurs $t_{min}$ after the final pulse so data acquisition should begin $0.5 \times t_{min}$ seconds after the final pulse and last for a time $t_1+t_2+t_3+t_4$. Therefore, the total time to acquire the image is approximately $2(t_1+t_2+t_3+t_4) = 54 \times t_{min} = 40$ ms. The data set contains 1728 complex points divided into 27 groups of 64. The phases and amplitudes of the data in the 27 groups have to be corrected as described below before a two dimensional Fourier transform is performed.

Phase and Amplitude Corrections

In a conventional imaging experiment, use of Equation [10] and the definition of k-space would allow the signal acquired, $\rho(k)$, to be related to the real-space image, $\rho(r)$, through a two dimensional Fourier relationship $$\rho(k) = \int \rho(r) e^{-i2\pi k \cdot r} dr \quad [13]$$

The assumptions underlying this equation are not valid for the present invention. Conventionally, in the absence of a phase-encoding gradient, each signal would have the same amplitude and phase. However, this is not true for the present invention, because the relative amplitudes and phases of the signals depend on the amplitudes and phases of the r.f. pulses and it is impossible to choose a set that will generate uniform signals. Equation [13] is therefore modified by an extra complex factor $Z_{kx} = A_p \cdot e^{i\Phi_p}$ that depends on the coherence pathway of each signal and it becomes $$\rho(k) = \int \rho(r) Z_{kx} e^{-i2\pi k \cdot r} dr \quad [14]$$

Before Fourier transforming the data it is necessary to correct the data set by removing the $Z_{kx}$. The corrections can be done theoretically although in practice empirical corrections may be more reliable.

Theoretical Correction

The amplitude of a signal generated by a series of pulses depends in a complicated manner on the amplitudes of the r.f. pulses. The contribution made by each pulse depends on the coherence order of the signal before and after the pulse. Thus, for example, the transition $+1 \rightarrow -1$ has a $$\frac{\cos(\alpha) - 1}{2}$$

dependence on flip angle ($\alpha$), while the $+1 \rightarrow -+1$ transition has a $$\frac{\cos(\alpha) + 1}{2}$$

dependence and therefore, for instance, the signal $p = (1,1,-1,1,-1)$ has an amplitude of $\sin(\alpha)(-\cos(\beta)+1)(\cos(\gamma)-1)(\cos(\delta)-1)(\cos(\epsilon)-1)/16$. If, as would be most usual, the pulses were all to have the same phase then the phase of the signals would be either 0 or 180° depending on whether the amplitudes given above were positive or negative. In general, the phase of the signal, $\Phi_{signal}$, depends on the phases of the pulses, $\Phi_{r.f.}$, through $$\Phi_{signal} = \Phi_{r.f.} \Delta p \quad [15]$$

where $\Delta p$ is a vector representing the changes in coherence order induced by an r.f. pulse, i.e. $\Delta p_i = p_i - p_{i-1}$ with $\Delta p_1 = p_1$.

Figure 5:
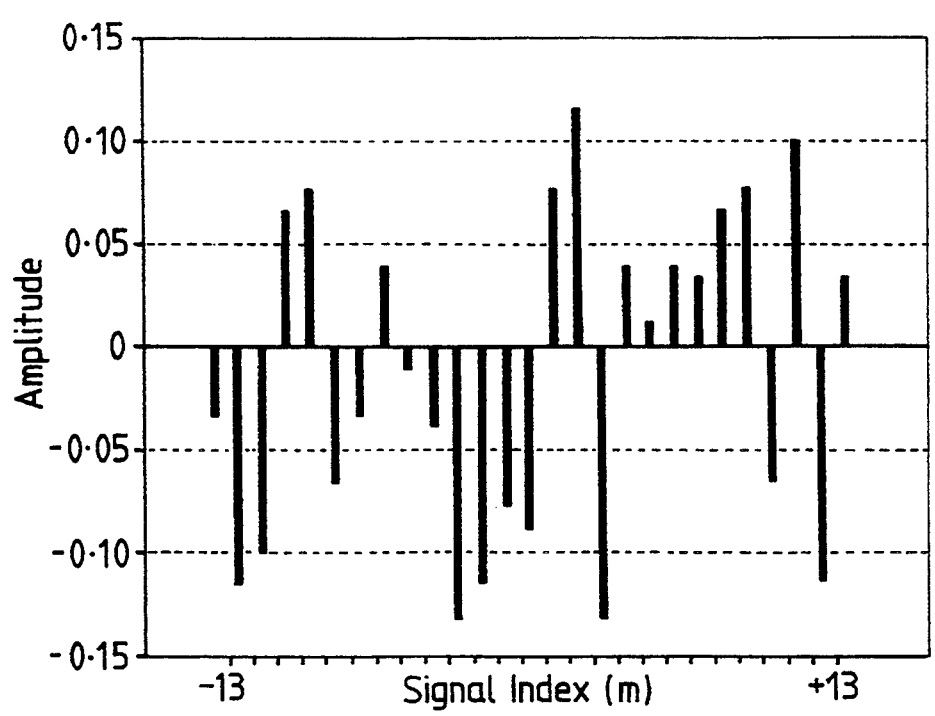
FIG. 5 shows the relative signal amplitudes and phases (0 or 180°) of the signals generated in the basic embodiment.

FIG. 5 shows an example of the theoretical amplitudes and phases for all 27 signals from 5 pulses with flip angles 45°, 60°, 120°, 90°, 180° respectively, with the intervals between pulses in the ratio 9:3:1:14. The analysis becomes more complicated if the effects of relaxation and diffusion are considered, and hence an empirical correction for the factor $Z_{kx}$ may be preferable in most circumstances of practical interest.

Empirical Correction

If the phase-encoding gradients are set to zero then the only dependence on $k_x$ in Equation [14] is through the $Z_{kx}$ coefficients. This dependence allows these coefficients to be estimated empirically for subsequent use In correcting data acquired with phase-encoding gradients.

The procedure is to carry out an initial experiment to acquire one set of data without the phase-encoding gradients and to calculate the phase and amplitude corrections necessary to convert the data into a set with uniform phase and amplitude. An apodisation function such as sine-bell could be applied at this stage. The corrections are then stored in a look-up table, which is used in all subsequent experiments where phase-encoding is included. The look-up table need only be calculated once, initially, since it is not dependent on the object being imaged. In principle the look-up table should only depend on the r.f. pulses, although the effects of gradient eddy-currents may mean that the table needs to be recalculated if the orientation or amplitude of the read gradient is altered. It is important to correct the raw data for dc offsets and this should be done before generating or applying the look-up table. In embodiments (such as those described later) which are more complicated than the basic embodiment, it may be difficult to ensure that the echo maxima are precisely evenly spaced; for these embodiments the look-up table also contains information to allow the maxima to be shifted to the correct positions. This would provide fine correction to the coarse "calibration" which would also usually be provided (see the section entitled "Experimental calibration of the gradients to achieve the desired timing of the echoes").

In one implementation of the look-up table, the best signal in the control data set is utilised as a reference and a correction file is generated which contains the information required to convert each of the other signals into identical copies of the reference. If $\rho(i,j)$ is a data point in the original data set, where i is the signal index number (row in FIG. 3), j is the data point within the signal and $i_{ref}$ is the index for the reference signal, then the correction file contains $\rho(i_{ref},j)/\rho(i,j)$ for all i and j. The positions of the echo maxima should be corrected if necessary before the correction file is generated or applied.

Theory for the First Modified Embodiment

A more generalised form of the theory, applicable to the first (and also further) modifications of the basic embodiment, is now described.

There are a number of reasons why it may be desirable to modify the basic embodiment outlined above in relation to FIGS. 3 to 5. Firstly, in the basic embodiment r.f. pulses are transmitted while the read gradient is applied, and unless these pulses are very short (less than a few microseconds) they will restrict the effective field of view. Secondly, the maximum digitization rate may limit the gradient strength that can be used for the read gradient and it may be possible to speed up the experiment by applying a stronger gradient to generate the signals and a weaker gradient during reading of the data.

With regard to the first reason, it is advantageous that the read gradient (and optionally the phase-encoding gradient) is switched off during the r.f. pulses. For most standard imaging spectrometers gradients can only be switched on and off relatively slowly (typical gradient rise rates are 2 Gcm$^{-1}$ms$^{-1}$) and it may not be possible to switch the gradients sufficiently fast during the shorter pulse intervals to satisfy the assumptions underlying Equation [1]. For static magnetic field inhomogeneities due to imperfect shimming or local susceptibility effects Equation [1] holds regardless of the gradient sequence used as regards the timings of spin and stimulated echoes. It also holds in the basic embodiment for gradient echoes arising from a constant externally applied magnetic field gradient, but does not hold for such echoes when the gradient varies. For maximum signal strength, the spin echoes and gradient echoes should be made to coincide. However, when the gradient varies, this is not generally possible. In this case, the gradient echoes are more important, and their timings are governed by the following equation, which is a more general version of Equation [1]

$$p \cdot Q_{read} = 0 \qquad [16]$$

where $Q_{read}$, originally defined in Equation [6b], is now generalised to allow for the gradient switching. It is still a vector representing the phase gradient developed across the sample as a result of pulsed magnetic field gradients but with components defined as $$Q_{read\,i} = \int \gamma G_{read}(t) dt \qquad [17]$$

integration being over the appropriate time interval.

Figure 6:
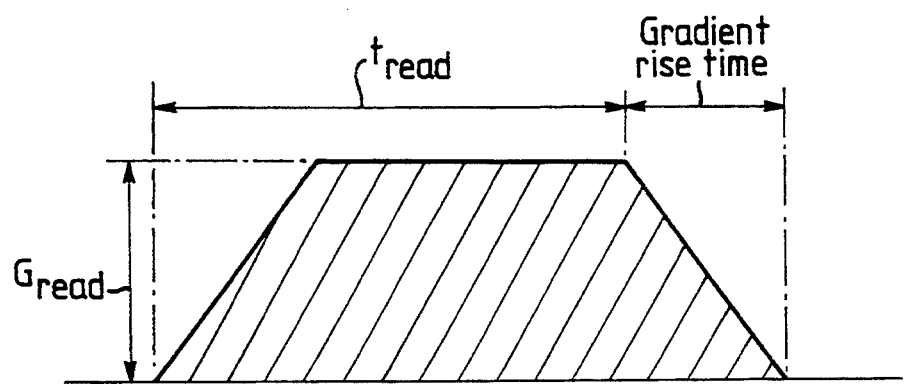
FIG. 6 is a sketch illustrating timing definitions for a trapezoidal gradient pulse.

Assuming a uniform and equivalent rise and fall rate and that the effects of gradient eddy currents have been sufficiently compensated for, the gradient pulses are approximately trapezoidal, and Equation [17] then simplifies to $$Q_{read\,i} = \gamma \cdot G_{read\,i} \cdot t_{read\,i} \qquad [17a]$$

where $t_{read\,i}$ is the length of a read gradient pulse defined from the beginning of the rise of the pulse to the beginning of the fall, as illustrated in FIG. 6. $G_{read\,i}$ is the strength of the gradient during this time interval. A minimum time must be left after the gradient has been switched off before the gradient strength can be considered to have returned to zero and an r.f. pulse can be transmitted.

To generate uniformly separated gradient echoes in a read gradient that is kept constant after the final pulse, using the same arguments given in relation to Equation [1], Equation [16] shows that $Q_{read}$ must be of the form $$Q_{read} = Q_y(1,3,\ldots,3^{(N-3)}, \tfrac{1}{2}(3^{(N-2)}+1)m) \qquad [18]$$

or an equivalent set obtained by permutation of the first $N-3$ delays.

$Q_{phase}$ is defined similarly to $Q_{read}$ with components given as $$Q_{phase\,i} = \int \gamma G_{phase}(t) dt \qquad [19]$$

If it is assumed that the phase-encoding gradients will be much smaller than the read gradients, then the phase-encoding gradients can be kept on during the r.f. pulses. If further it is assumed that the switching times for the gradients are insignificant then $$Q_{phase\,i} = \gamma G_{phase\,i} t_{phase\,i} = \gamma G_{phase\,i} t_{rf\,i} \qquad [20]$$

In this more generalised theory, the intervals between pulses may no longer be multiples of 3 of each other if the read gradient is switched or otherwise varied, in which case it follows from Equation [19] or [20] that the phase-encoding gradient should no longer be constant since the $Q_{phase}$ must be of the form $$Q_{phase} = Q_x(1,3,\ldots,3^{(N-3)},0,0) \qquad [21]$$

or an appropriate permutation. $Q_x$ in Equation [21] and $Q_y$ in Equation [18] are constants that allow Equations [11] and [12] to be recast as $$k_x = l \cdot Q_x / 2\pi \qquad [22]$$

and $$k_y = m \cdot Q_y / (2\pi \cdot N_2) \qquad [23]$$

Figure 7:
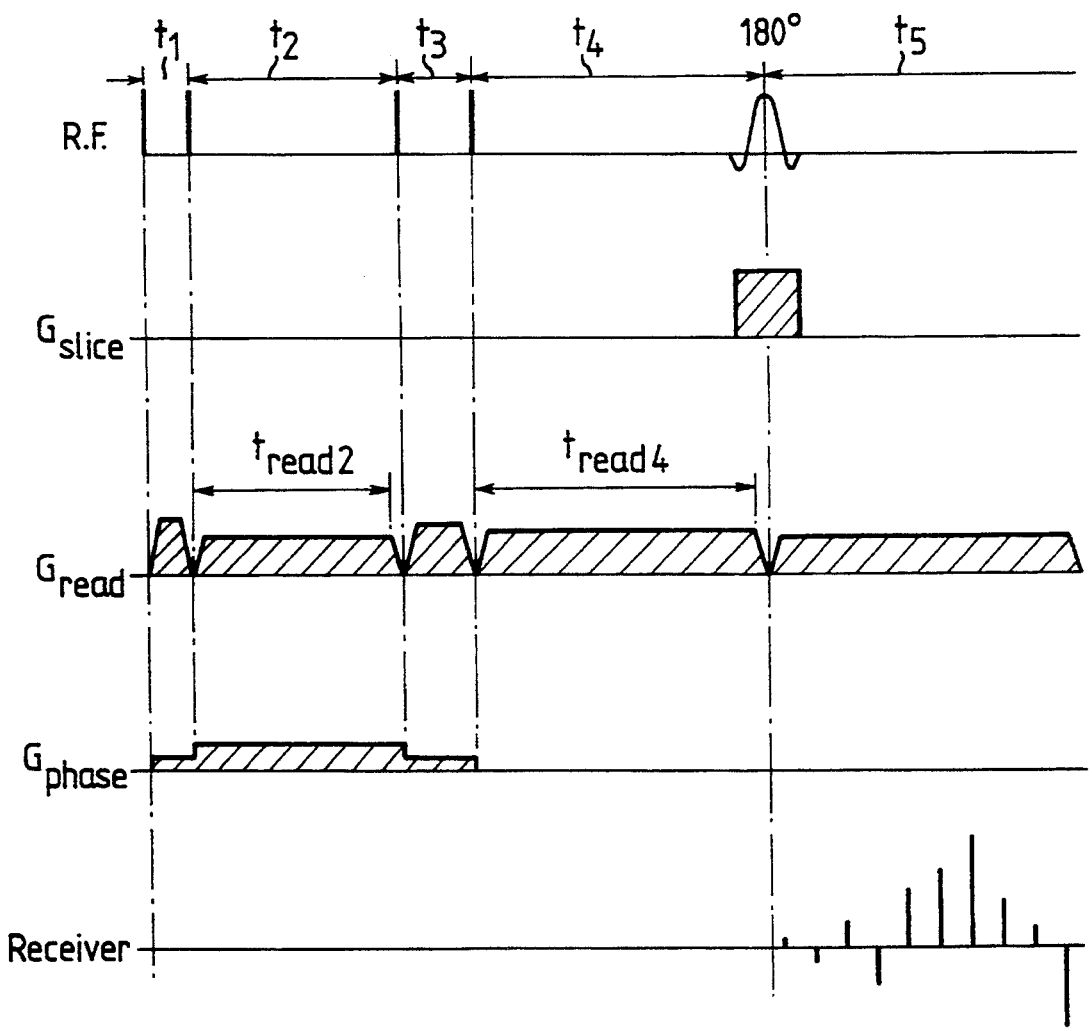
FIG. 7 is a pulse sequence diagram for a first modified embodiment of the invention.

A first modified embodiment of the invention is now described with reference to FIG. 7.

EXAMPLE 2

To generate an image as per Example 1 but with the read gradient switched off for each r.f. pulse.

Assuming it takes a minimum of 1 ms to switch a gradient from 0 to 2 Gcm$^{-1}$, the lengths of the read gradient pulses are chosen to correspond with the pulse intervals in Example 1, but each pulse interval is then extended by 1 ms to allow for gradient switching, as follows $$t_{read} = t_{min} \cdot (1,9,3,14,m) = (0.75 \text{ ms}, 6.75 \text{ ms}, 2.25 \text{ ms}, 10.5 \text{ ms}, t)$$

$$t_{rf} = (1.75 \text{ ms}, 7.75 \text{ ms}, 3.25 \text{ ms}, 11.5 \text{ ms}, t)$$

$$t_{phase} = t_{rf} = (1.75 \text{ ms}, 7.75 \text{ ms}, 3.25 \text{ ms}, 11.5 \text{ ms}, t)$$

The signals are acquired in a gradient $G_{read}$. With $\Delta t = 11.7\ \mu s$ then from Equations [23] and [12]

$$Q_y = N_2 \cdot \gamma \cdot G_{read} \cdot \Delta t = 1.5 \gamma \text{rad cm}^{-1}.$$

Since $t_{read} = 0.75 \cdot (1,9,3,14,m)$ and we require $Q_{read} = Q_y(1,9,3,14,m)$, then $G_{read} = (1\ 2.0, 2.0, 2.0, 2.0, 2.0)$Gcm$^{-1}$ The bounds on $k_x$ mean that $Q_x = 2\pi / FOV_x$ from Equation [22]. Thus, using Equations [20] and [21]

$G_{phase} = (0.0134, 0.0273, 0.0217, 0.0, 0.0) \text{Gcm}^{-1}$

The total imaging time (45 ms) is only 5 ms longer than in Example 1. This time could be reduced if apparatus capable of faster gradient switching were used.

In this experiment the spin echoes and gradient echoes no longer coincide and the signal amplitudes will therefore have some dependence on $T^*_2$ relaxation which can be improved with shimming. Although more gradient switchings are required than in Example 1 there are still relatively few compared with the Echo Planar Imaging technique alluded to earlier.

Further modifications to the basic embodiment are also possible in view of the link between the spin echoes and the gradient echoes having been broken. For instance, since it is only for the shortest pulse interval that gradients cannot be switched sufficiently rapidly the $T^*_2$ dependence can be minimised by ensuring that most of the gradient echoes and spin echoes coincide. This can be achieved by judicious choice of the gradients and pulse intervals. Alternatively, if the maximum gradient strength available is greater than the gradient strength that can be used during reading of the data, the increased strength can be used during generation of the signals to reduce the imaging time.

The general requirements on the gradients and r.f. pulse intervals are derived from the bounds on $k_x$ and $k_y$ and by substituting Equations [22] and [23] into Equations [18] and [21].

$$Q_{read} = \frac{2\pi N_2}{FOV_y} (1,3,\ldots,3^{(N-3)}, \tfrac{1}{2}(3^{(N-2)} - 1), m) \qquad [24]$$

$$Q_{phase} = 2\pi\, FOV_x (1,3,\ldots,3^{(N-3)},0,0) \qquad [25]$$

As usual, any equivalent set obtained by permutation of the first N−3 intervals is possible. Assuming trapezoidal read gradient pulses, the components of $Q_{read}$ are given by Equation [17a], and with $$t_{min} = \frac{2\pi N_2}{\gamma G_{readN} FOV_y}$$

this gives $$t_{read_i} G_{read_i} = 3^{i-1} t_{min} G_{readN} \quad 1 \leq i \leq N-2$$

$$t_{readN-1} G_{readN-1} = \tfrac{1}{2}(3^{(N-2)}+1) t_{min} G_{readN} \qquad [26]$$

to generate the uniform set of signals by $t_{min}$. Similarly we assume near rectangular phase-encoding pulses so that the components of $Q_{phase}$ are given by Equation [20] and therefore $$t_{phase_i} G_{phase_i} = 3^{i-1} \frac{2\pi}{\gamma FOV_x} \quad 1 \leq i \leq N-2 \qquad [27]$$
$$= 0 \qquad i = N-1, N$$

Theory for the Second Modified Embodiment

Figure 8A:
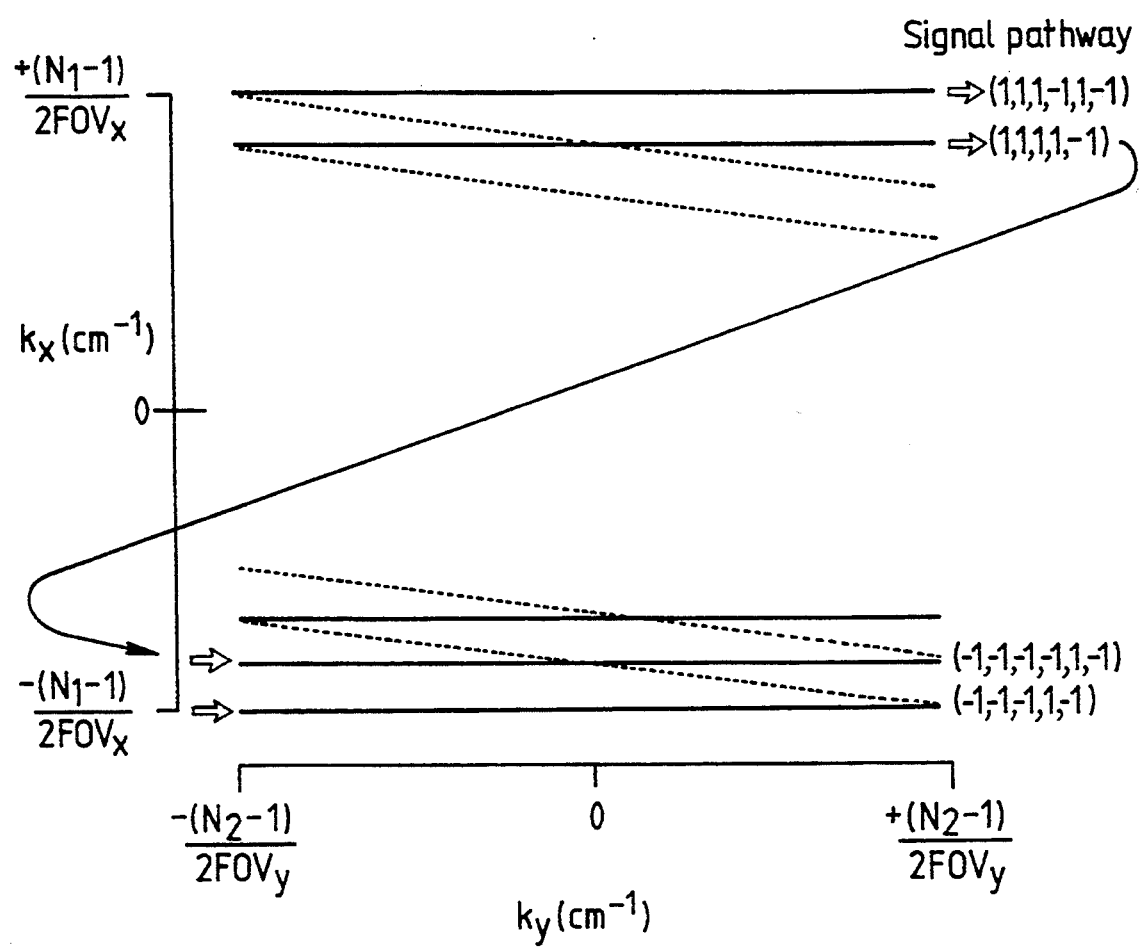
FIG. 8a is a k-space diagram for a second modified embodiment of the invention.
Figure 8B:
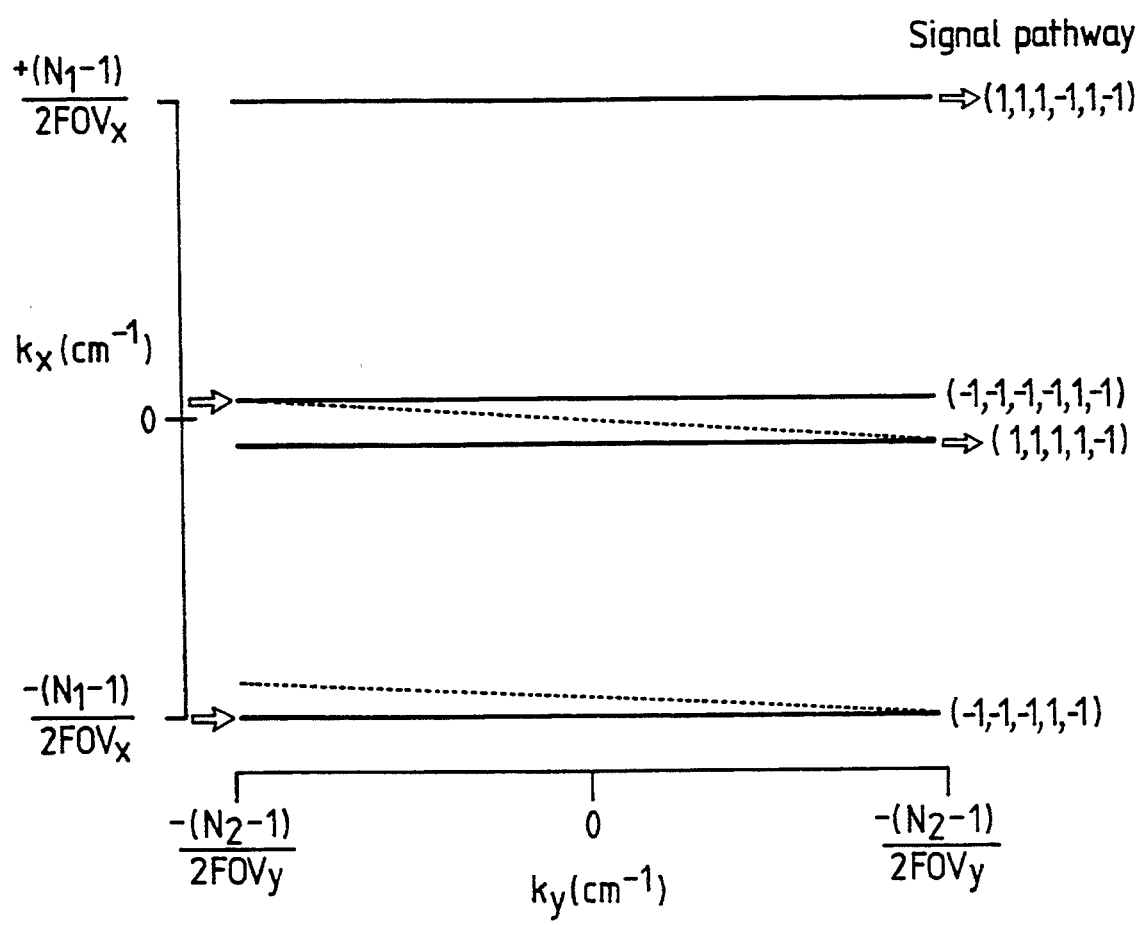
FIG. 8b is a k-space diagram for an alternative version of the second modified embodiment.

If it is desired to generate an image with an increased resolution, this could be achieved by adding an extra pulse with the correct pulse intervals (thus allowing, for example, the generation of an 81×64 image). Alternatively, by adding a 180° degree refocussing pulse after the first acquisition, the $3^{(N-2)}$ signals can be made to refocuss again to generate $2\times 3^{(N-2)}$ signals (for example, a 54×64 image). The second modified embodiment concerns this latter alternative. In this second modified embodiment, the phase encoding can be arranged, for instance, either so that the second set of echoes interleave with the first set in the k-space diagram (FIG. 8a), or, in an alternative version of the second modified embodiment, so that the first set of signals form the top half of the k-space diagram and the second set of signals form the bottom half (FIG. 8b), or, in a further alternative version, so that the signals fill k-space in sequential order.

In the first case (FIG. 8a) a delay is added either side of the 180° refocussing pulse to allow for the extra phase-encoding, and the existing phase-encoding gradients are doubled in strength. Equation [25] effectively becomes $$Q_{phase} = \frac{2\pi}{FOV_x} (2,6,\ldots,2.3^{(N-3)},0,0,1) \qquad [28]$$

For a 54×64 image, signal p=(0,0,0,1,−1) would have a phase-encoding of 0 rad cm$^{-1}$, p=(1,0,0,−1,1,−1) would have a phase-encoding of $$\frac{2\pi}{FOV_x} \text{ rad cm}^{-1},$$

p=(1,0,0,1,−1) would have a phase-encoding of $$\frac{4\pi}{FOV_X} \text{ rad cm}^{-1},$$

and so on.

In the second case (FIG. 8b) the phase-encoding gradient is kept on for part of the interval before the first 180° pulse so that Equation [25] becomes $$Q_{phase} = \frac{2\pi}{FOV_x} (1,3,\ldots,3^{(N-1)},3^{(N-2)}/2,0,0) \qquad [29]$$

For a 54×64 $Q_{phase}$ would be $$\frac{2\pi}{FOV_X} (1,3,9,13.5,0,0),$$

the signal with p=(0,0,0,1,−1) would have a phase-encoding of $$\frac{27\pi}{FOV_X} \text{ rad cm}^{-1},$$

p=(−1,−1,−1,1,−1) has a phase-encoding of $$+\frac{\pi}{FOV_X} \text{ rad cm}^{-1}$$

and p=(1,1,1,−1,1,−1) has a phase-encoding of $$-\frac{\pi}{FOV_X} \text{ rad cm}^{-1}.$$

In this way the first and last signals acquired have the least phase-encoding and the central signals the most phase-encoding.

In the third case, the sign of the final phase-encoding gradient could be changed to fill k-space in sequential order, so that, for a 54×64 image, $$Q_{phase} = \frac{2\pi}{FOV_x} (1,3,9,-13.5,0,0).$$

EXAMPLE 3

To generate an image as per Example 2 but with 54×64 pixels.

Figure 9:
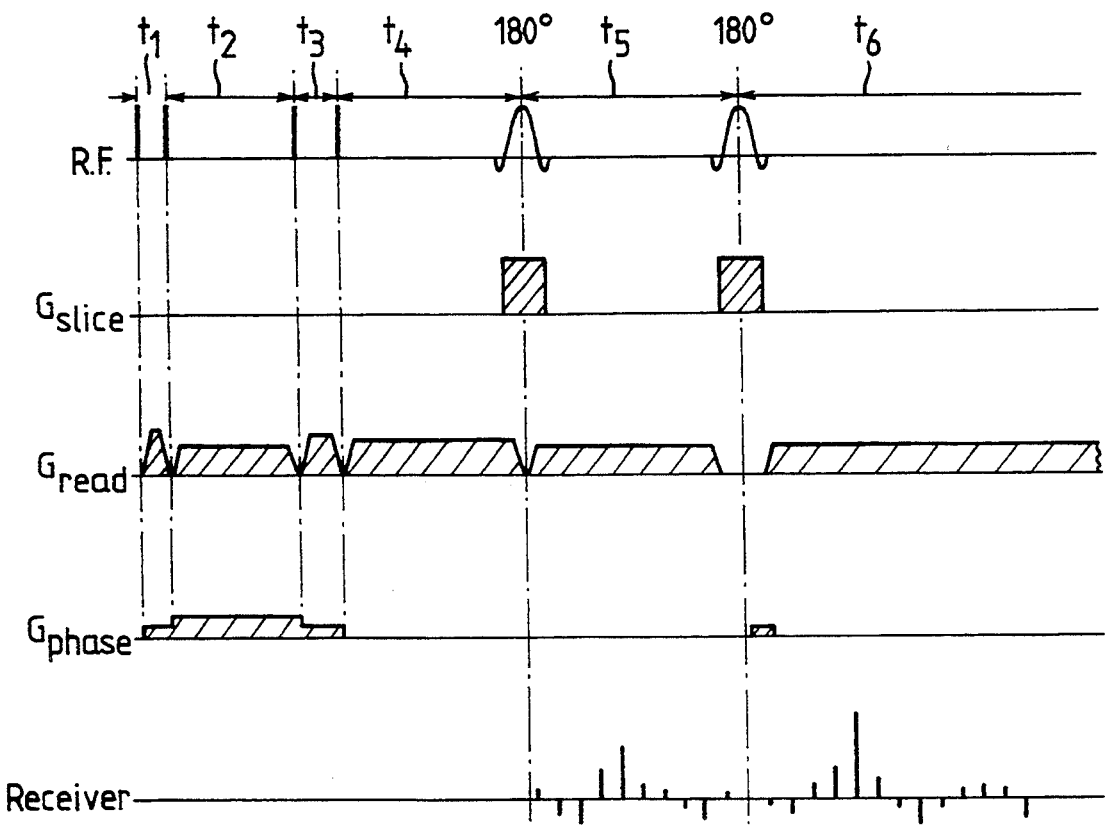
FIG. 9 is a pulse sequence diagram for the second modified embodiment of the invention.

The first case referred to above (FIG. 8a) is exemplified by way of the pulse sequence diagram of FIG. 9. Interleaving of the first and second sets of echoes is achieved by the small amount of phase encoding applied just after the centre of the r.f. refocussing pulse. In extending Example 2 to acquire a 54×64 image, the total time taken to generate the image is extended from 45 ms to approximately 45 ms+27$t_{min}$=65 ms.

In a possible variant of the second modified embodiment, the 9 signals generated by 3 pulses would be repeatedly refocussed using a series of 180° pulses. The signal to noise ratio for the image should be better but there will be more gradient switchings as the resolution increases by $2^N$ rather than $3^N$.

Theory for the Third Modified Embodiment

In all the preceding embodiments the final pulses have been 180° pulses with slice-selection gradients ($G_{slice}$). This filters out all signals whose coherence order does not change as $+1 \rightarrow -1$ and therefore cuts down the total number of signals observed. Slice selection is essential In most situations of practical Interest. However, it would be advantageous to modify the slice selection so that it does not act as a filter. This achieved in the third modified embodiment.

Figure 10:
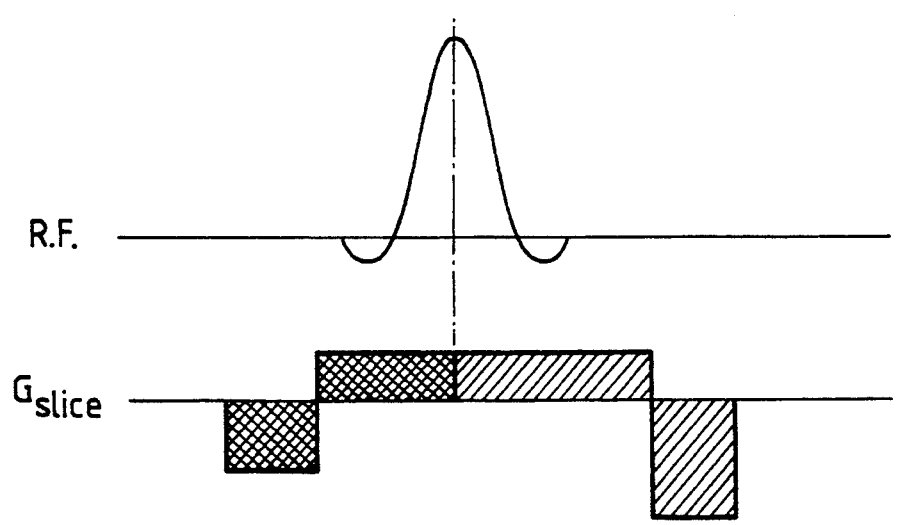
FIG. 10 is a partial pulse sequence diagram illustrating a third modified embodiment of the invention.

FIG. 10 shows the correct gradient switching for non-filtering slice selection. The gradients must be separately balanced either side of the centre of the shaped pulse, otherwise partial attenuation of some signals could occur. Thus in FIG. 10 the total area of each like-shaded region is arranged to be zero. The shaped pulse should no longer correspond to a 180° flip angle as this would be the optimum condition to lose the signals recovered by the improved slice-selection.

Since signals such as p=(1,0,0,0,−1) will now be detected, the $Q_{read}$ and $Q_{phase}$ need to be altered. If the $T^*_2$ weighting is to be kept small then It is assumed that virtual spin echoes such as p=(−1,0,0,0,−1) will still not be detected (although in principle they could be detected as pure gradient echoes). However, signal p=(0,0,0,0,−1) will be detected as a gradient echo by switching the read gradient before data acquisition, so that a total of $\frac{1}{2}(3^{(N-1)}+1)$ signals (41 for N=5) will be acquired if we set $$Q_{read} = \frac{2\pi N_2}{FOV_y} (1,3,\ldots,3^{(N-2)},m) \ 0 \leq m \leq \frac{1}{2}(3^{(N-1)} - 1) \quad [30]$$

$$( = \frac{2\pi N_2}{FOV_y} (1,3,9,27,m) \text{ for } N = 5 \text{ pulses})$$

or any equivalent set obtained by permutation of the first N−3 intervals.

There are a number of possibilities for the phase-encoding in this embodiment. In particular, if the sign of the gradient is switched after the penultimate pulse and the gradient is switched off over half way through the r.f. pulse interval, then we produce $$Q_{phase} = \frac{2\pi}{FOV_y} (1,3,\ldots,3^{(N-3)},-\leq \frac{1}{2}(3^{(N-2)} + 1)0) \quad [31]$$

$$( = \frac{2\pi}{FOV_y} (1,3,9,-14,0) \text{ for } N = 5 \text{ pulses})$$

Figure 11:
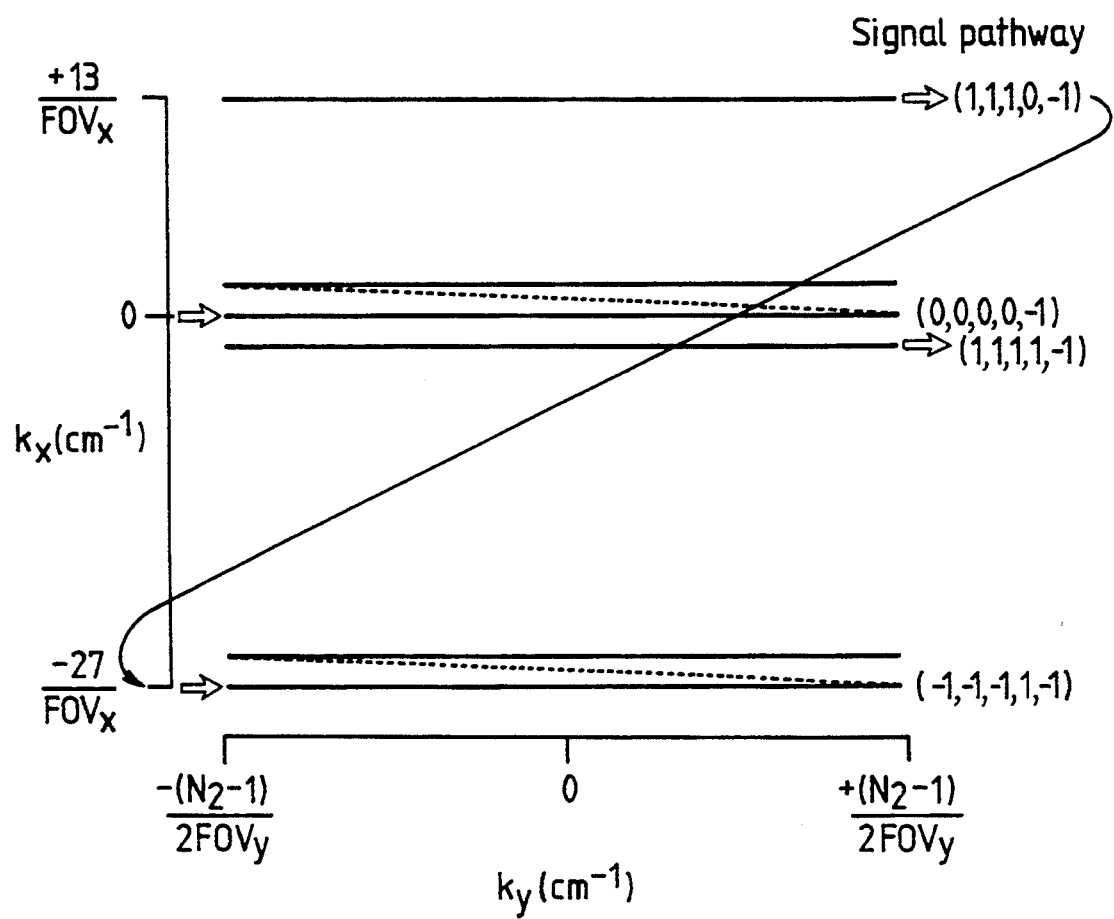
FIG. 11 is a k-space diagram for the third modified embodiment.

By this method k-space is filled asymmetrically since 1 in Equation [5b] would range from −27 to +13. This is not a serious problem since there is no requirement for k-space to be filled symmetrically and there exist schemes for symmetrizing the data before Fourier transformation. Indeed it could be considered an advantage since there would be an apparent improvement in resolution. Note that the k-space lattice is not filled sequentially but in the order Indicated in FIG. 11. The first signal acquired follows the coherence pathway p=(0,0,0,0,−1), the next 12 signals fill up k-space to the top, then the remaining signals fill up k-space from the bottom. Alternatively, an additional phase-encoding pulse could be applied after the final r.f. pulse but before data acquisition to give $$Q_{phase} = \quad [32]$$

$$\frac{2\pi}{FOV_x} (1,3,\ldots,3^{(N-3)},-(3^{(N-2)} + 1)/2,-(3^{(N-2)} - 1)/4)$$

to generate a symmetric k-space lattice.

Higer Coherence Order Imaging

In principle images can be acquired using fewer r.f. pulses if higher coherence orders can be generated. This could arise for coupled spin systems where operators of the form $I_xI_z$ can be generated. The requirement is the capability to generate density operators of rank greater than one. The rank of an operator is not affected by r.f. pulses but is changed by evolution under the influence of a spin Hamiltonian containing coupling terms, so that a simple 90-τ-θ sequence will generate the high rank terms. Once these terms have been generated transitions between them can be induced by r.f. pulses as in the simple case of the single spin-½ nucleus. The maximum coherence order that can be generated is equal to the rank while the maximum rank depends on the coupling pattern of the spin system and the spins of the component nuclei. For two spin-½ nuclei the maximum rank is 2. Thus 5 levels of coherence are available (−2,−1,0,+1) and +2). Transitions between these 5 levels can be induced by r.f. pulses so that the number of signals generated by N pulses is $2 \times 5^{N-2}$. Only four pulses would be needed to produce 50 signals.

For higher coherence order imaging, the basic equations given above would still apply, except that, for instance, the elements in the Q vectors would need to be powers of 5 of each other, for example ($Q_1, 5 \times Q_1, 25 \times Q_1, \ldots$). Of course, powers of any lower integer greater than two (3 or 4 in this case) would also yield satisfactory results.

Experimental Calibration of the Gradients to Achieve the Desired Timing of the Echoes In practice, the effects of eddy currents, finite pulses lengths and other timing errors may mean that the gradients need to be adjusted from their estimated values by experimental (or possibly theoretical) calibration in order to achieve uniform spacing of the echoes. Calibration of the read gradients is considered first. The first step in calibrating the read gradients is to decide upon the r.f. pulse intervals, $t_{rf}$, the lengths of the read gradient pulses, $t_{read}$, and the value of the read gradient during signal acquisition, $$G_{readN} \cdot \text{Calculate } t_{min} = \frac{2\pi N_2}{\gamma FOV_y G_{readN}}$$

and the approximate values for all the other read gradients $G_{read}$ from Equation [26].

Assuming for example that the read gradient intervals are in the approximate ratio 1:9:3:14, then $$G_{read4} \approx 14 t_{min} G_{read5}/t_{read4} + \epsilon$$

where the addition term, $\epsilon$, compensates for the time after switching $G_{read5}$ on but before data acquisition begins (see FIG. 6)

$$G_{read3} \approx 3 t_{min} G_{read5}/t_{read3}$$

$$G_{read2} \approx 9 t_{min} G_{read5}/t_{read2}$$

$$G_{read1} \approx t_{min} G_{read5}/t_{read1}$$

Figure 12:
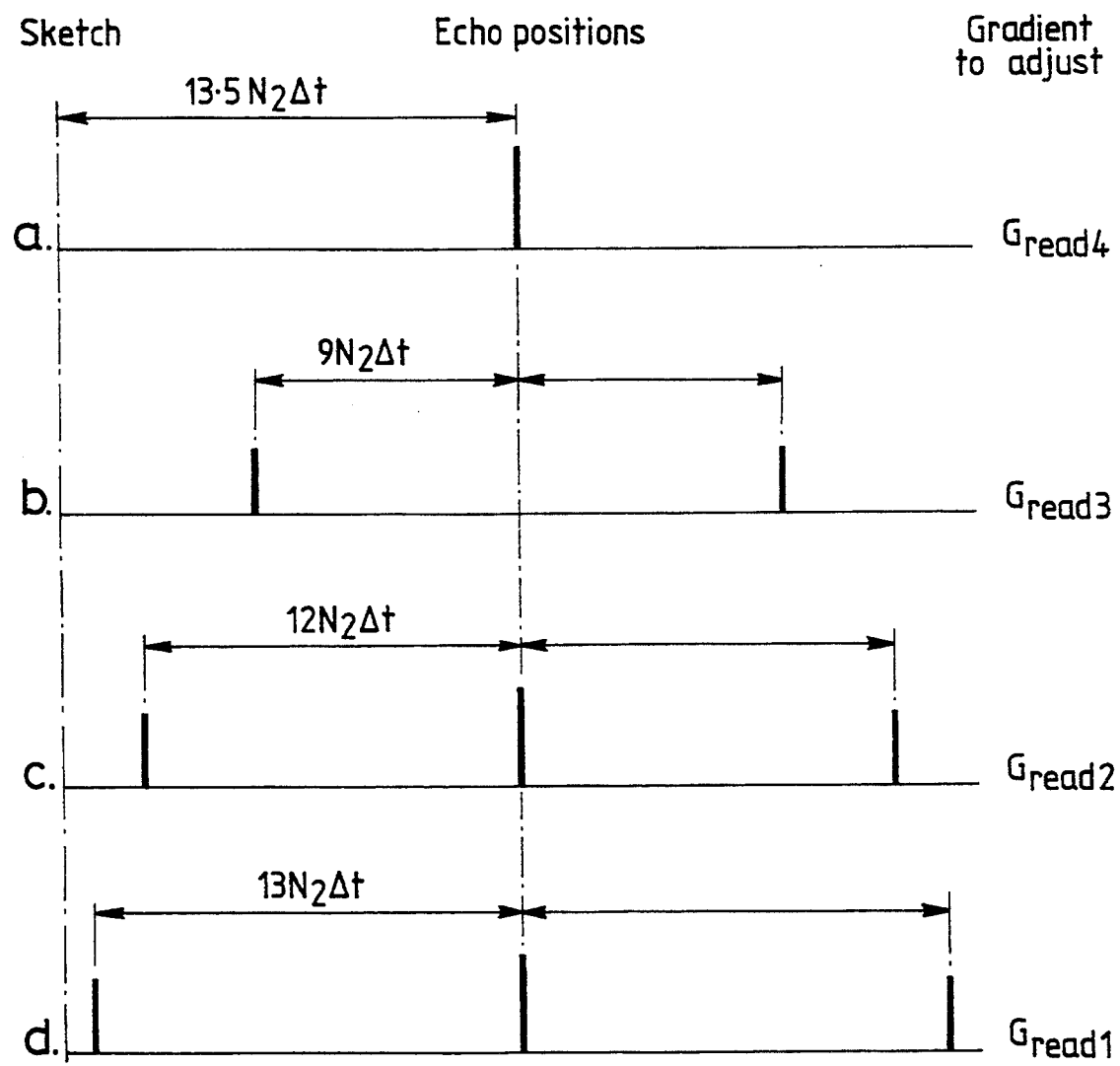
FIGS. 12 are a series of sketches illustrating the experimental calibration of the gradients.

Calibration then proceeds in the fashion illustrated in FIGS. 12 in relation to Example 2. For the calibration, the phase-encoding gradients are switched off.

The read gradients are calibrated in turn starting with $G_{read4}$. First (Sketch (a)), all the r.f. pulses except for the 180° slice selection pulse and the previous (4th) pulse are switched off. Only one echo should be generated, arising from the signal p=(0,0,0,1,−1). $G_{read4}$ is adjusted until the echo maximum occurs in the centre of the total acquisition period. Next (Sketch (b)) the 3rd pulse is added to generate the additional signals p=(0,0,1,1,−1) and p=(0,0,−1,1, −1), and $G_{read3}$ is adjusted until the separation of the signals is $3t_{min}$. Then (Sketch (c)) the 3rd pulse is switched off and the 2nd pulse is switched on to generate the three signals p=(0,0,0,1,−1), p=(0,1,1,1,−1) and p=(0,−1,−1,1,−1). $G_{read2}$ is adjusted until the separation of the three echoes is $(9+3)t_{min}$. Finally (Sketch (d)) the 2nd pulse is switched off and the 1st pulse is switched on to generate signals p=(0,0,0,1,−1), p=(1,1,1,1,−1) and p=(−1,−1,−1,1,−1). $G_{read1}$ is adjusted until the echoes are separated by $(1+9+3)t_{min}$. The gradient settings are then confirmed by checking the positions of all the echoes using all r.f. pulses. Any small mispositioning can be corrected for in the data processing.

In the third modified embodiment (using the modified slice selection) the calibration is done in a slightly different way. After the final pulse a short read gradient pulse with opposite sign is applied to compensate for the time before the start of data acquisition. This short pulse is calibrated by switching off all r.f. pulses except the final one. The only signal that can be detected is p=(0,0,0,0,−1). The additional gradient pulse is adjusted until the signal maximum occurs $0.5t_{min}$ into the acquisition period. Then the penultimate pulse is switched on and 4 echoes appear. $G_{read4}$ is adjusted until the 3rd signal occurs at $27t_{min}$ after the 1st signal. The other calibrations are performed as above.

It will be appreciated that calibration sequences other than those described above could be employed. For instance, calibration could be performed by switching the first or last excitation pulses on.

Considering now the calibration of the phase-encoding gradients, it is not actually usually necessary to calibrate these gradients. The amplitude of these gradients is much smaller than the amplitude of the read gradients and so they suffer less from the effects of eddy currents. Nevertheless, for completeness, a technique for calibrating these gradients, analogous to the technique for calibrating the read gradients, is now described. In this technique, a modified form of the pulse sequence is employed in which the read gradients are removed completely and all r.f. pulses apart from the first one and final one are set to zero. A phase-encoding gradient, comparable in strength to the original read gradients, but along the direction of the phase-encoding axis, is switched on before the final r.f. pulse and is only switched off again after the end of the data, acquisition. With no phase-encoding gradients except this one gradient, a single echo (p=(1,1,1, . . . ,1,−1)) is produced. The timing of this echo is recorded. Next, the first phase-encoding gradient (the one spanning interval $t_1$) is additionally switched on. A large value for this gradient is selected (approximately 5-10 times the value used in the actual imaging experiment). The shift in the timing of the echo, $\Delta t_1$, is noted. Next the first phase-encoding gradient is switched off and the second phase-encoding gradient (the one spanning interval $t_2$) is switched on. The shift in the timing of the echo, $\Delta t_2$, is noted. This procedure is repeated for each of the other phase-encoding gradient pulses. Having obtained the set of $\Delta t_i$'s, values are calculated for the phase-encoding gradients which would produce shifts in the appropriate ratio (for example, 1:3:9 for the basic embodiment, or 1:3:9:−13.5 or 2:6:18:0.5 for the first modified embodiment). The set of gradients thus calculated are finally scaled for the dimensions of the field of view as given in Equation [11].

It will be understood that the calibration referred to above is not dependent on the object under test, but only on the characteristics of the NRM apparatus. Therefore, calibration need only be performed once.

Results

Figure 13:
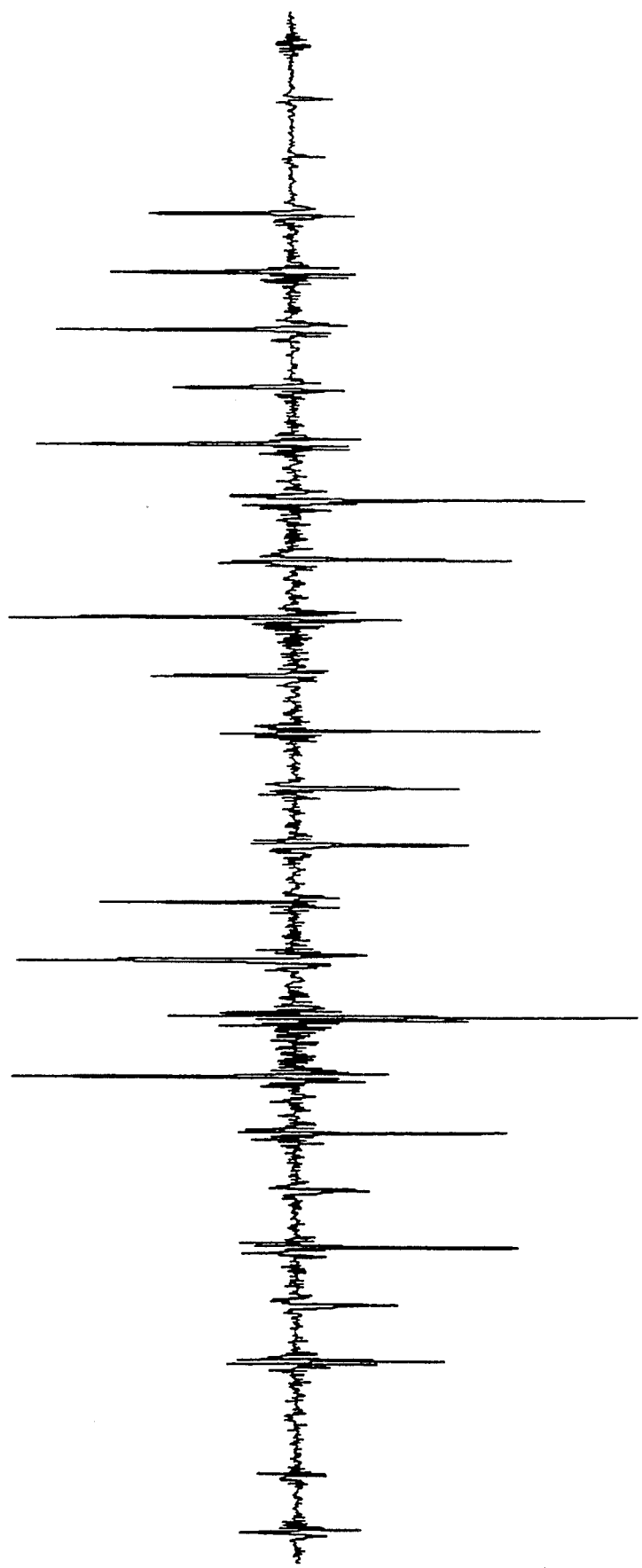
FIGS. 13 and 14 show respectively a set of signals and an image obtained using the present invention.

FIG. 13 shows a complete set of 27 signals obtained using the parameter values given In Example 2. The signals have been acquired without phase-encoding; from these signals the data correction look-up table is generated.

Figure 14:
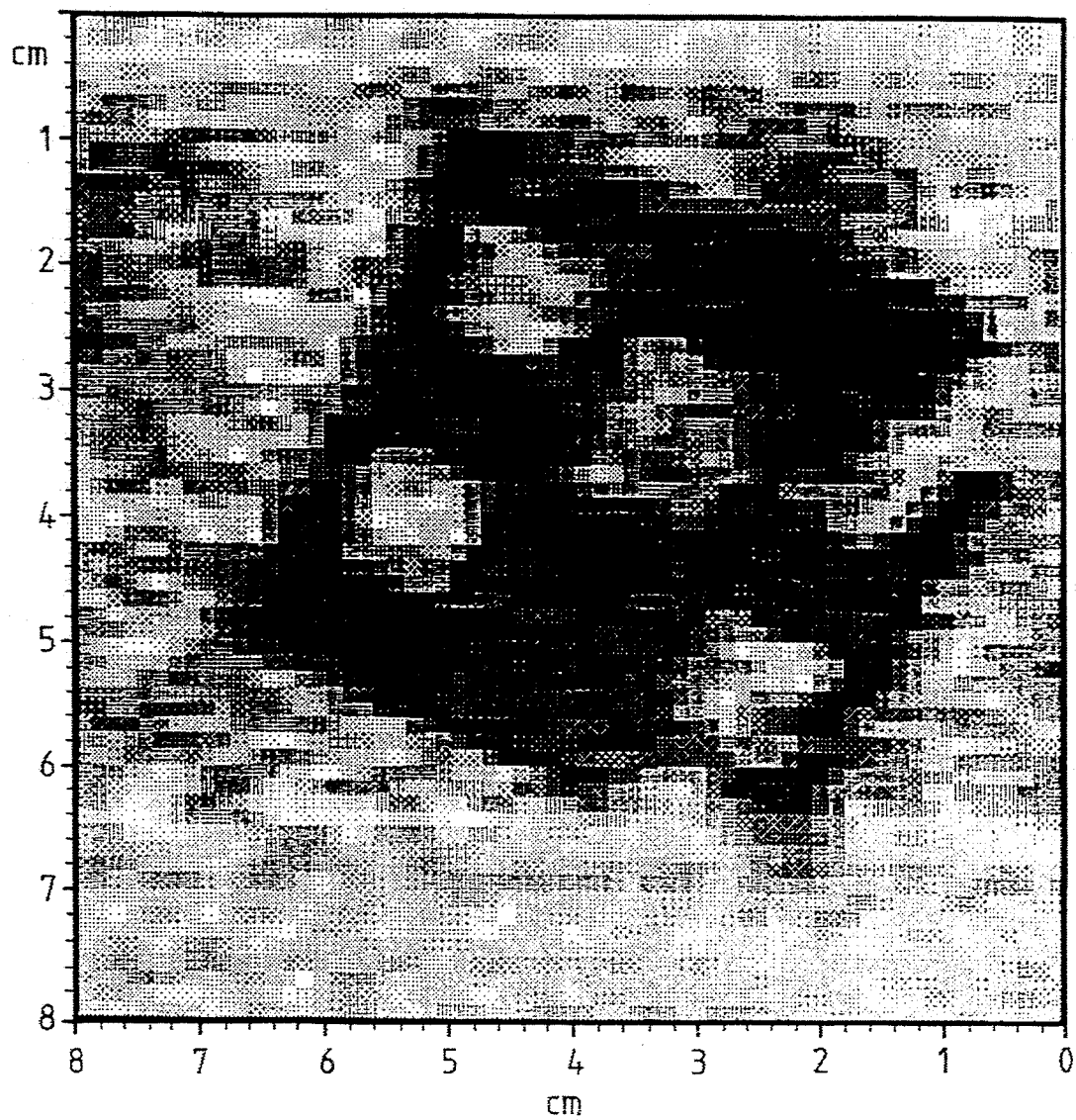

FIG. 14 shows a 2 mm thick 27×64 pixel image of a water-filled phantom acquired using the parameter values given in Example 2.

It will be understood that the invention has been described above purely by way of example, and modifications of detail can be made within the scope of the invention.

I claim:

1. A method of nuclear magnetic resonance testing an object, comprising:
   subjecting the object to a magnetic field, the field having a gradient component for encoding spatial information about the object,
   applying excitation pulses at selected intervals to excite nuclear magnetic resonance, at least two of the intervals and the encoding gradient component during those intervals being selected such that, for such intervals, the values of the integral of the gradient component are proportioned according to consecutive powers of an integer, I, greater than two, and detecting the resonance response signals.

2. A method according to claim 1 wherein at least one of the magnetic field and the excitation pulses are adjusted to provide the desired resonance response signals.

3. A method according to claim 2 wherein the adjustment is based on experimentally predetermined information.

4. A method according to claim 2 wherein the adjustment is to provide the desired timing for the signals.

5. A method according to claim 1 wherein resonance response signals are adjusted after detection.

6. A method according to claim 5 wherein the adjustment is carried out before Fourier transformation.

7. A method according to claim 5 wherein at least one of the phase, timing and amplitude of the resonance response signals are adjusted.

8. A method according to claim 5 wherein the adjustment is based on experimentally predetermined information.

9. A method according to claim 1 wherein the interval between the last excitation pulse proportioned according to a power of I and the succeeding excitation pulse is less than $I^L \cdot t_{min}$, where L is the number of such intervals and $t_{min}$ is the smallest interval, and said interval is approximately equal to $$\frac{(I^L + 1)}{2} \cdot t_{min}.$$

10. A method according to claim 1 wherein such intervals number at least three.

11. A method according to claim 1 wherein the gradient component is substantially constant during such intervals, and such intervals are proportioned according to said consecutive powers.

12. A method according to claim 1 wherein said gradient component is zero during each excitation pulse adjacent such intervals, rises in each such interval for a rise time $t_1$ to a value which is equal for each such interval, remains at such interval for a dwell time $t_2$ and falls back to zero for a fall time $t_3$, and the respective values of $t_2 + (t_1 + t_3)/2$ for each such interval are proportioned according to said consecutive powers.

13. A method according to claim 1 wherein said gradient component is a read gradient component and is zero during each excitation pulse adjacent such intervals.

14. A method according to claim 1 wherein a further excitation pulse is applied to refocus the resonance response signals.

15. A method according to claim 1 wherein slice selection is performed via a non-filtering gradient pulse.

16. A method according to claim 15 wherein a slice selection excitation pulse is applied during the gradient pulse, and the integral of the gradient pulse with respect to time up to the centre of the slice selection excitation pulse and the equivalent integral taken after the centre are both equal to zero.

17. A method as in claim 1 wherein k+2 RF excitation pulses are used in said applying step and $3^k$ response signals are used to generate an image of said object.

18. A method as in claim 1 wherein a phase-encoding gradient is switched on at the beginning of the first-to-occur of said intervals and then switched off at the end of a subsequent one of said intervals prior to the last-to-occur of said intervals.

19. Apparatus for nuclear magnetic resonance testing an object, comprising
means for subjecting the object to a magnetic field, the field having a gradient component for encoding spatial information about the object,
means for applying excitation pulses at selected intervals to excite nuclear magnetic resonance, at least two of the intervals and the encoding gradient component during those intervals being selected such that, for such intervals, the values of the integral of the gradient component are proportioned according to consecutive powers of an integer, I, greater than two, and
means for detecting the resonance response signals.

20. Apparatus according to claim 19 further comprising storage means in which is stored information concerning how to adjust at least one of the magnetic field and the excitation pulses to provide the desired resonance response signals, and means for so adjusting the field and/or pulses.

21. Apparatus according to claim 19 wherein the interval between the last excitation pulse proportioned according to a power of I and the succeeding excitation pulse is less than $I^L \cdot t_{min}$, where L is the number of such intervals and $t_{min}$ is the smallest interval, and said interval is approximately equal to $$\frac{(I^L + 1)}{2} \cdot t_{min}.$$

22. Apparatus according to claim 19 wherein such intervals number at least three.

23. Apparatus according to claim 19 wherein the application means is arranged to apply a further excitation pulse to refocus the resonance response signals.

24. Apparatus according to claim 19 further comprising means for performing slice selection via a non-filtering gradient pulse.

25. Apparatus as in claim 19 wherein said means for applying excitation pulses includes means for applying k+2 RF excitation pulses and said means for detecting detects $3^k$ resonance response signals includes means for utilizing all the detected $3^k$ response signals to generate an image of said object.

26. Apparatus as in claim 19 wherein said means for subjecting includes means for switching a phase-encoding gradient on at the beginning of the first-to-occur of said intervals and for switching it off at the end of a subsequent one of said intervals prior to the last-to-occur of said intervals.

* * * * *